United States Patent
Mao et al.

(10) Patent No.: US 9,960,088 B2
(45) Date of Patent: May 1, 2018

(54) END POINT DETECTION IN GRINDING

(75) Inventors: Yi-Chao Mao, Zhongli (TW); Jui-Pin Hung, Hsin-Chu (TW); Jing-Cheng Lin, Hsin-Chu (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 1764 days.

(21) Appl. No.: 13/290,879

(22) Filed: Nov. 7, 2011

(65) Prior Publication Data

US 2013/0115854 A1    May 9, 2013

(51) Int. Cl.
| | |
|---|---|
| *B24B 49/10* | (2006.01) |
| *H01L 21/66* | (2006.01) |
| *B24B 37/013* | (2012.01) |
| *B24B 7/22* | (2006.01) |
| *H01L 23/31* | (2006.01) |

(52) U.S. Cl.
CPC .............. *H01L 22/26* (2013.01); *B24B 7/228* (2013.01); *B24B 37/013* (2013.01); *B24B 49/10* (2013.01); *H01L 22/12* (2013.01); *H01L 23/3114* (2013.01); *H01L 2924/0002* (2013.01)

(58) Field of Classification Search
CPC ....... B24B 37/013; B24B 49/16; B24B 49/04; B24B 49/10; B24B 7/228; H01L 22/12; H01L 22/26; H01L 23/3114; H01L 2924/0002
USPC .............................................. 451/41, 5, 8, 10
See application file for complete search history.

(56) References Cited

U.S. PATENT DOCUMENTS

| | | | | |
|---|---|---|---|---|
| 5,035,087 A * | 7/1991 | Nishiguchi et al. | ............ | 451/14 |
| 5,069,002 A * | 12/1991 | Sandhu et al. | ............ | 451/1 |
| 5,245,794 A * | 9/1993 | Salugsugan | ............ | 451/10 |
| 5,308,438 A * | 5/1994 | Cote et al. | ............ | 216/86 |
| 5,668,063 A * | 9/1997 | Fry et al. | ............ | 438/5 |
| 5,827,111 A * | 10/1998 | Ball | ............ | 451/14 |
| 5,827,112 A * | 10/1998 | Ball | ............ | 451/21 |
| 5,830,041 A * | 11/1998 | Takahashi et al. | ............ | 451/8 |
| 5,851,135 A * | 12/1998 | Sandhu et al. | ............ | 451/5 |
| 6,165,052 A * | 12/2000 | Yu et al. | ............ | 451/41 |
| 6,207,533 B1 * | 3/2001 | Gao | ............ | 438/424 |
| 6,293,845 B1 * | 9/2001 | Clark-Phelps | ............ | 451/5 |

(Continued)

FOREIGN PATENT DOCUMENTS

| | | |
|---|---|---|
| CN | 101456151 | 6/2009 |
| CN | 102176431 | 9/2011 |

(Continued)

*Primary Examiner* — Marc Carlson
(74) *Attorney, Agent, or Firm* — Slater Matsil, LLP

(57) ABSTRACT

A method for performing grinding includes selecting a target wheel loading for wafer grinding processes, and performing a grinding process on a wafer. With the proceeding of the grinding process, wheel loadings of the grinding process are measured. The grinding process is stopped after the target wheel loading is reached. The method alternatively includes selecting a target reflectivity of wafer grinding processes, and performing a grinding process on a wafer. With a proceeding of the grinding process, reflectivities of a light reflected from a surface of the wafer are measured. The grinding process is stopped after one of the reflectivities reaches the target reflectivity.

15 Claims, 8 Drawing Sheets

(56) References Cited

U.S. PATENT DOCUMENTS

| | | | |
|---|---|---|---|
| 6,309,276 B1* | 10/2001 | Tsai et al. | 451/5 |
| 6,383,058 B1* | 5/2002 | Birang et al. | 451/41 |
| 6,464,564 B2* | 10/2002 | Sandhu et al. | 451/7 |
| RE38,029 E | 3/2003 | Cote et al. | |
| 6,672,943 B2 | 1/2004 | Vogtmann et al. | |
| 6,739,944 B2* | 5/2004 | Sandhu et al. | 451/5 |
| 6,764,379 B2* | 7/2004 | Finarov | 451/6 |
| 6,932,674 B2* | 8/2005 | Lahnor et al. | 451/8 |
| 7,131,889 B1* | 11/2006 | Taylor | 451/8 |
| 7,390,744 B2* | 6/2008 | Jia et al. | 438/689 |
| 7,513,818 B2* | 4/2009 | Miller et al. | 451/5 |
| 7,614,932 B2* | 11/2009 | Finarov | 451/6 |
| 7,727,049 B2* | 6/2010 | Benvegnu et al. | 451/5 |
| 8,466,553 B2 | 6/2013 | Cheng et al. | |
| 8,712,575 B2* | 4/2014 | Bhagavat et al. | 700/174 |
| 2001/0039064 A1 | 11/2001 | Ushio et al. | |
| 2004/0142637 A1* | 7/2004 | Petroski et al. | 451/41 |
| 2005/0075055 A1 | 4/2005 | Lanier et al. | |
| 2008/0180695 A1* | 7/2008 | Komiyama et al. | 356/612 |
| 2009/0008794 A1* | 1/2009 | Wu et al. | 257/777 |
| 2009/0104846 A1* | 4/2009 | Junge et al. | 451/5 |
| 2010/0285723 A1* | 11/2010 | Lin et al. | 451/5 |
| 2011/0104987 A1 | 5/2011 | David et al. | |
| 2011/0237160 A1* | 9/2011 | Bhagavat et al. | 451/5 |
| 2011/0256805 A1 | 10/2011 | David et al. | |
| 2011/0275281 A1 | 11/2011 | David et al. | |

FOREIGN PATENT DOCUMENTS

| | | |
|---|---|---|
| JP | 2008186873 | 8/2008 |
| JP | 2010-062251 | 3/2010 |
| KR | 10-2005-0069771 | 7/2005 |
| KR | 1020070024735 | 3/2007 |
| WO | 2005123335 | 12/2005 |

* cited by examiner

END POINT DETECTION IN GRINDING

BACKGROUND

In the manufacturing of integrated circuits, grinding is a commonly used technology. In a grinding process, a grinding wheel is placed over a wafer. The grinding wheel and the wafer both rotate, so that the thickness of the wafer is reduced due to the removal of the surface layers by the grinding wheel.

In the manufacturing of device wafers, grinding may be used in the backside thinning of silicon substrates, for example, in the formation of through-silicon vias (TSVs). There are other processes in which the grinding technology may be used. In the formation of fan-out chip scale packages, device wafers may be sawed, and the known-good-dies are selected and attached onto a carrier, with the known-good-dies spaced apart from each other. The known-good-dies include copper posts for the formation of fan-out connections. A molding compound is then filled into the space between and over the known-good-dies to form a fan-out wafer. After the curing of the molding compound, a grinding process may be performed to remove the portions of the molding compound and other dielectric materials over the copper posts. After the copper posts are exposed, electrical connections may be made to connect to the copper posts, so that the connections to the fan-out wafer are extended into an area larger than the area of the known-good-dies.

Since the layers that are subject to the grinding are often thin layers, accurately stopping the grinding process on the right time is vital to the yield of the integrated manufacturing process. For example, in the manufacturing of the fan-out wafer, the grinding needs to be stopped when the copper posts in substantially all known-good-dies throughout the fan-out wafer are fully exposed, and substantially no over-grinding occur. In the existing grinding technology, a gauge is used to detect the total thickness of the fan-out wafer during the grinding process. When the total thickness is reduced to a pre-determined value, it is assumed that the copper posts are fully exposed. This detection method, however, is inaccurate, and may result in yield loss.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of detecting end points in the grinding processes is provided in accordance with various embodiments. The variations of the embodiments are discussed. Throughout the various views and illustrative embodiments, like reference numbers are used to designate like elements. It is appreciated that although fan-out wafers for chip level packages (CSP) are used as examples, the end-point detection methods in accordance with embodiments may also be used for detecting end points in the grinding of other types of wafers, such as device wafers.

Figure 1:
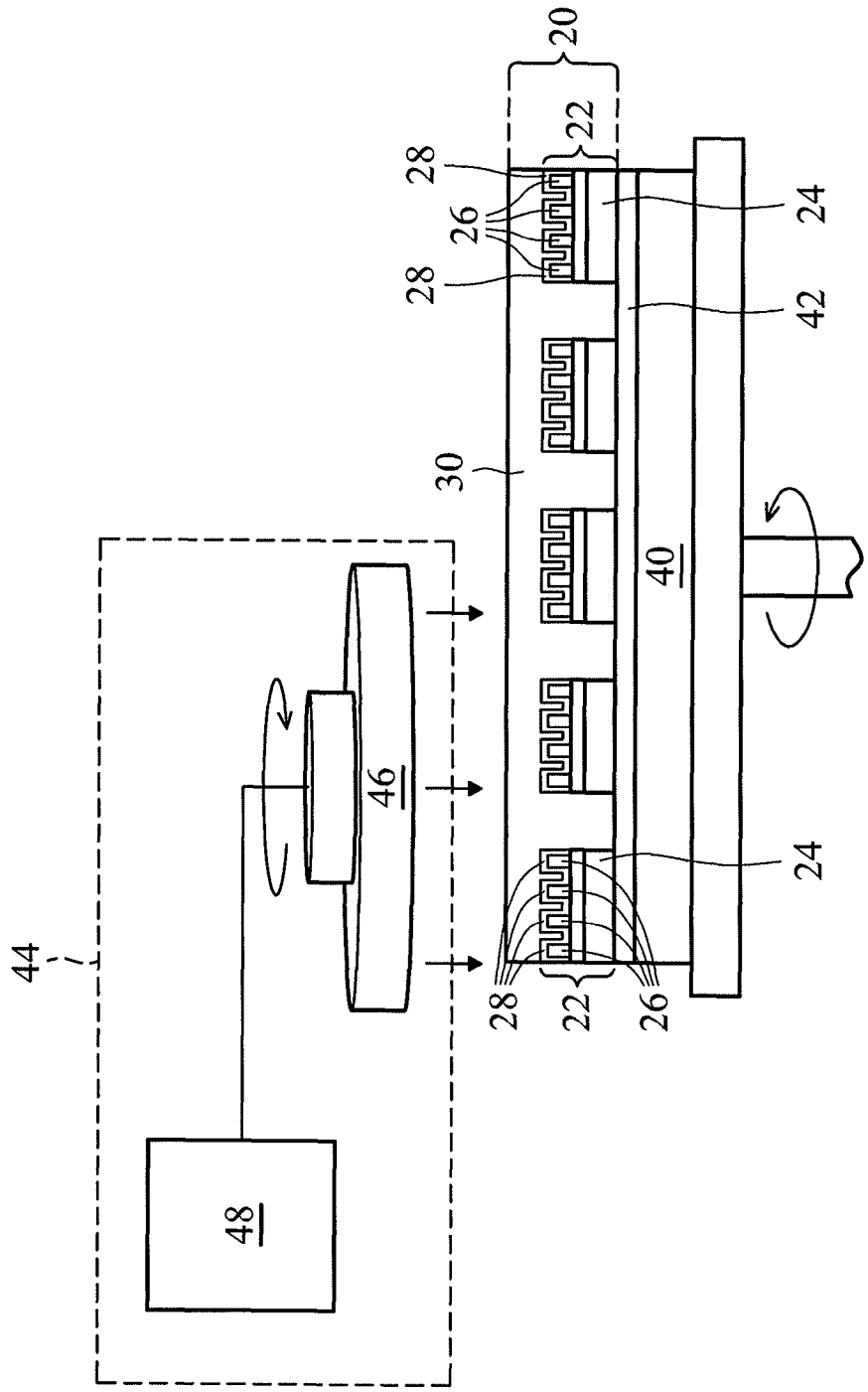
FIG. 1 illustrates a cross-sectional view of a wafer that includes device dies and a molding compound for molding the device dies, wherein a grinding process is performed on the wafer, and the wheel loading is measured.

FIG. 1 illustrates a cross-sectional view of wafer 20, which may be a fan-out wafer for forming fan-out connections, for example. Wafer 20 includes dies 22. In an embodiment, dies 22 are device dies that include active devices such as transistors (not shown). Dies 22 may be adhered on carrier 40 through adhesive 42. Adjacent to the top surface of dies 22 are metal posts 26 (which may be copper posts, for example), which are pre-formed in dies 22, and may be electrically coupled to the active devices in dies 22. In some embodiments, polymer layer 28, which may be a polyimide layer, is formed on metal post 26. Molding compound 30 is filled into the space between dies 22 and over die 22. It is noted that the materials and the structures of wafer 20 are examples for explaining the concept of the embodiments, and wafers with different materials and structures may be grinded using the end-point detection methods in accordance with embodiments. In accordance with exemplary embodiments, the grinding process is used to remove the portions of molding compound 30 and polymer layer 28, and to expose metal posts 26, so that fan-out connections may be formed to electrically couple to metal posts 26.

Wafer 20 is grinded by grinding tool 44, which includes grind wheel 46 that has grits for grinding the top surface of wafer 20. During the grinding process, grind wheel 46 and wafer 20 both rotate. Grinding tool 44 further includes control unit 48 for controlling the grinding process, and for controlling the action of grind wheel 46. During the grinding process, control unit 48 is capable of detecting of the surface being grinded, and adjusting the wheel loading of the grinding process accordingly. In some embodiments, grinding tool 44 adjusts wheel currents for driving grind wheel 46, and hence the wheel currents may be used to represent the wheel loading in accordance with exemplary embodiments. Exemplary grinding tools whose wheel currents can be used as the indication of wheel loading include DGP8761, which is manufactured by Disco Corporation. In alternative embodiments, the resistance force of the grinded surface and/or the wheel loading may be represented using other parameters.

Figure 2:
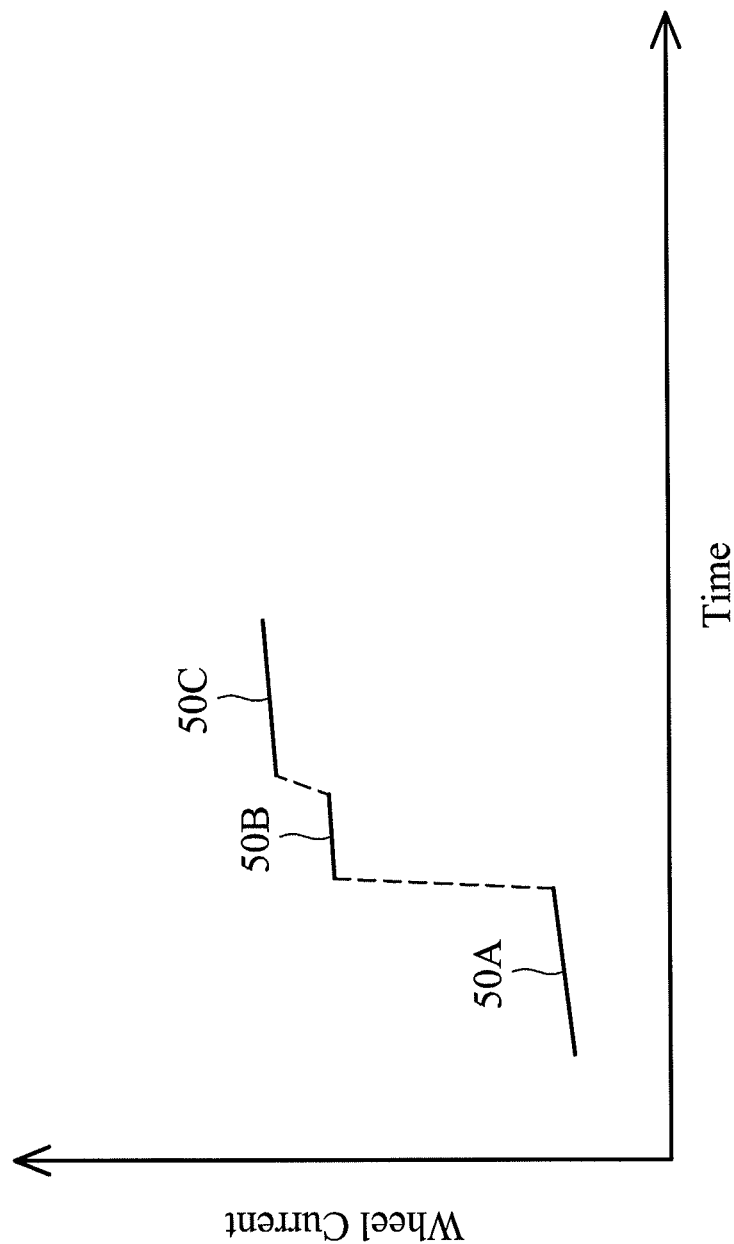
FIG. 2 schematically illustrates the wheel currents in the grinding process as a function of time.

FIG. 2 schematically illustrates the wheel currents as a function of grinding time in an exemplary grinding process of a sample wafer. In the grinding process, the wheel loading includes several sections, including 50A, 50B, and 50C, which correspond to grinding a molding compound layer, a polyimide layer, and a copper layer, respectively, of the sample wafer. FIG. 2 illustrates that for different materials, the wheel currents (wheel loadings) are different.

Figure 3:
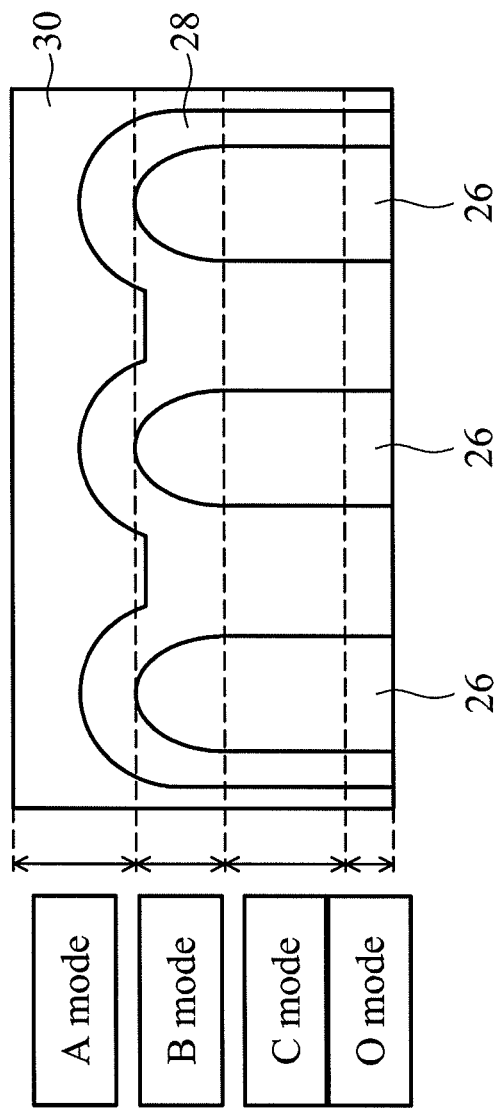
FIG. 3 illustrates a cross-sectional view of a portion of the wafer shown in FIG. 1, wherein different modes are used to represent the stages in a grinding process.

With the proceeding of the grinding process, upper layers are removed, and underlying layers are exposed and a grinded. FIG. 3 illustrates the cross-sectional view of a portion of the structure in FIG. 1, which portion includes metal posts 26, polymer layer 28, and molding compound 30. FIG. 3 schematically illustrates that the stages of the grinding process are represented by several modes, namely A mode, B mode, C mode, and O mode. During A mode, molding compound 30 and polymer layer 28 are grinded, and substantially none of metal posts 26 are grinded. During B mode, some of metal posts 26 throughout wafer 20 are exposed and are grinded, and the exposed metal posts 26 may have the tips being grinded, while the underlying portions having larger top-view areas may not be grinded yet. During the C mode, substantially all of the metal posts 26 are exposed and are grinded, and substantially no over-grinding occurs to metal posts 26 throughout wafer 20. In the O mode, over-grinding occurs. It is desirable that the optimal end point of the grinding is located in C mode, or at least in B mode, while A mode and O mode are not desired, and may be failure modes.

Since wheel loadings are different for grinding different materials (as indicated by FIG. 2), the wheel loadings in A mode, B mode, and C mode are different. The wheel loadings corresponding to the A, B, and C modes may be found by grinding a sample wafer, and inspect the sample wafer periodically during the grinding process to find the correlation between the modes and corresponding wheel loadings. The correlation may then be used for determining the optimal end points of the grinding processes, which grinding processes are used for grinding production wafers having the same structure as the sample wafer.

Figure 4:
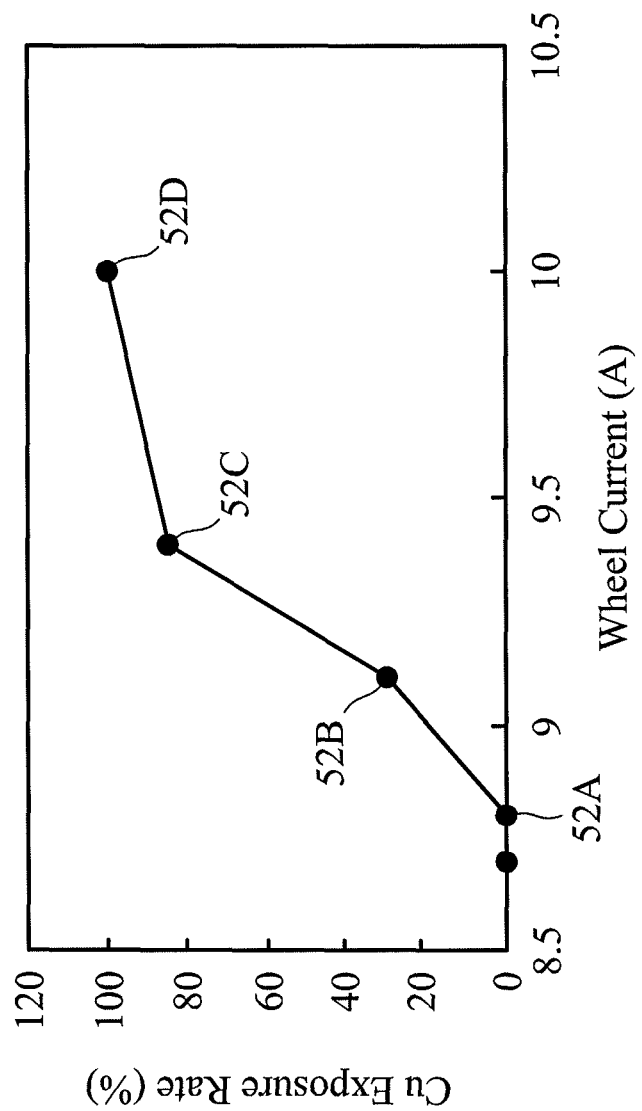
FIG. 4 schematically illustrates copper exposure rates of copper posts as a function of wheel currents in a grinding process.

FIG. 4 illustrates experiment results obtained from the grinding process of a sample fan-out wafer, wherein copper exposure rates (of metal posts 26) are illustrated as a function of the wheel loadings, which are expressed as wheel currents. Points 52A, 52B, 52C, and 52D are the points at which the sample fan-out wafer is inspected. Point 52A corresponds to the wheel current of 8.8 amps, at which time, out of 937 dies, the number of dies in A, B, C, and O modes are 936, 0, 0, and 1, respectively. Point 52B corresponds to the wheel current of 9.1 amps, at which time, the number of dies in A, B, C, and O modes are 666, 265, 2, and 1, respectively. Point 52C corresponds to the wheel current of 9.4 amps, at which time, the number of dies in A, B, C, and O modes are 150, 711, 73, and 1, respectively. Point 52D corresponds to the wheel current of 10 amps, at which time, out of 937 dies, the number of dies in A, B, C, and O modes modes are 9, 501, 424, and 1, respectively. It is observed that at point 52D, only 9 dies are still in A mode, while 925 dies out of 937 are either in B mode or C mode. After point 52D, To bring more dies from A and B modes into C mode, a further grinding is performed (using 10 amps wheel current) to remove an additional layer of wafer 20 that has thickness equal to about 1.1 μm. As a result, the number of dies in A, B, C, and O modes are 0, 16, 918, and 1, respectively. This is equivalent to 99.7 percent of copper exposure rate (FIG. 4). These experiment results indicate that the wheel loadings, such as wheel currents, can be used as an indicator for determining the optimal end points.

In general, in accordance with embodiments, a target wheel loading corresponding to the optimal end point may be found, for example, by performing a grinding process on a sample wafer and find a target wheel loading (such as the 10 amps current in FIG. 4). On the production wafers having the same structure as the sample wafer, the optimal end point may be when the target wheel loading is reached. In other embodiments, the end point is such determined that after the target wheel loading is reached, an extended grinding is performed to reduce the thickness of the wafer by a pre-determined grinding thickness (such as the 1.1 μm as in the example shown in FIG. 4). The pre-determined grinding thickness may also be between about 1 μm and about 5 μm. It is realized that this pre-determined grinding thickness is an example, and may be changed for grinding different wafers and for exposing different features. In yet other embodiments, the end point is such determined that after the target wheel loading is reached, an extended grinding is performed for an extended period of grinding time. In an exemplary embodiment, the extended grinding may be performed between about 10 seconds and about 50 seconds. The optimal duration for the extended grinding may be found through experiments. In some embodiments, grinding tool 44 as in FIG. 1 may automatically perform the extended grinding after the target wheel loading is reached, and then stop the grinding process. In other embodiments, the extended grinding process may be performed manually.

Figure 5:
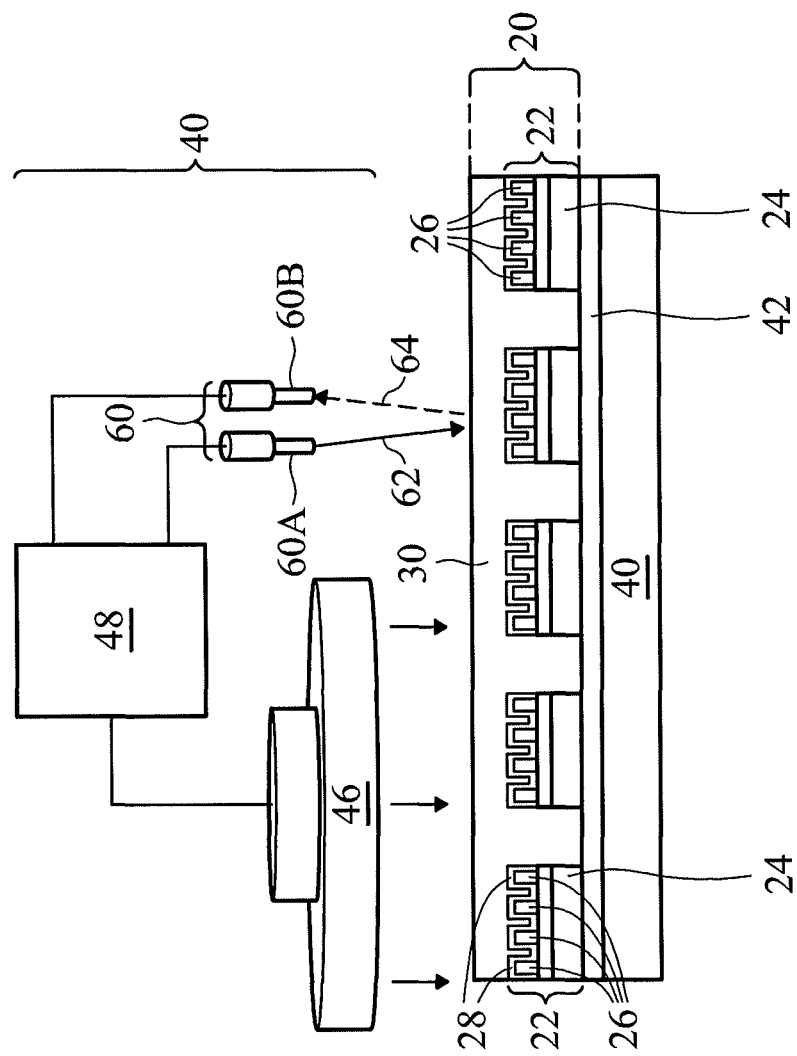
FIG. 5 illustrates a cross-sectional view of a wafer that comprises device dies and a molding compound for molding the device dies, wherein a grinding process is performed on the wafer, and a reflectivity of the wafer is measured.
Figure 6:
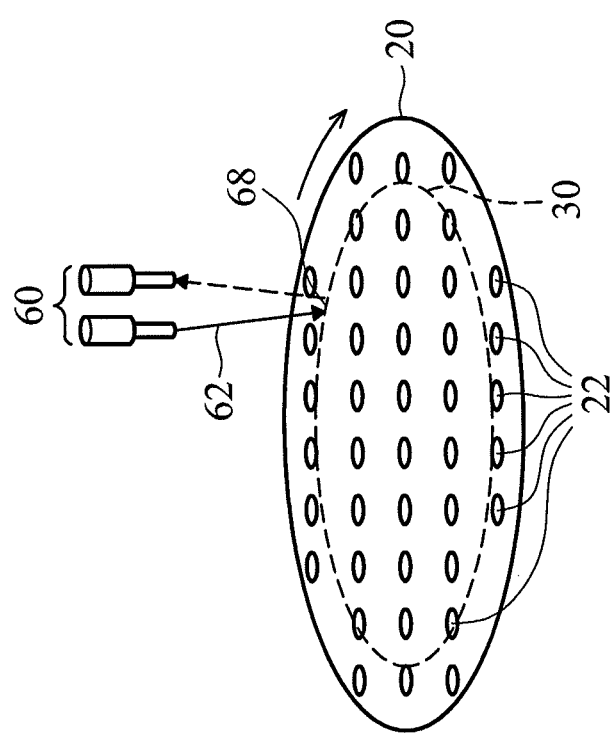
FIG. 6 illustrates that a light is emitted on a wafer for measuring the reflectivity, wherein the wafer is rotated.
Figure 7:
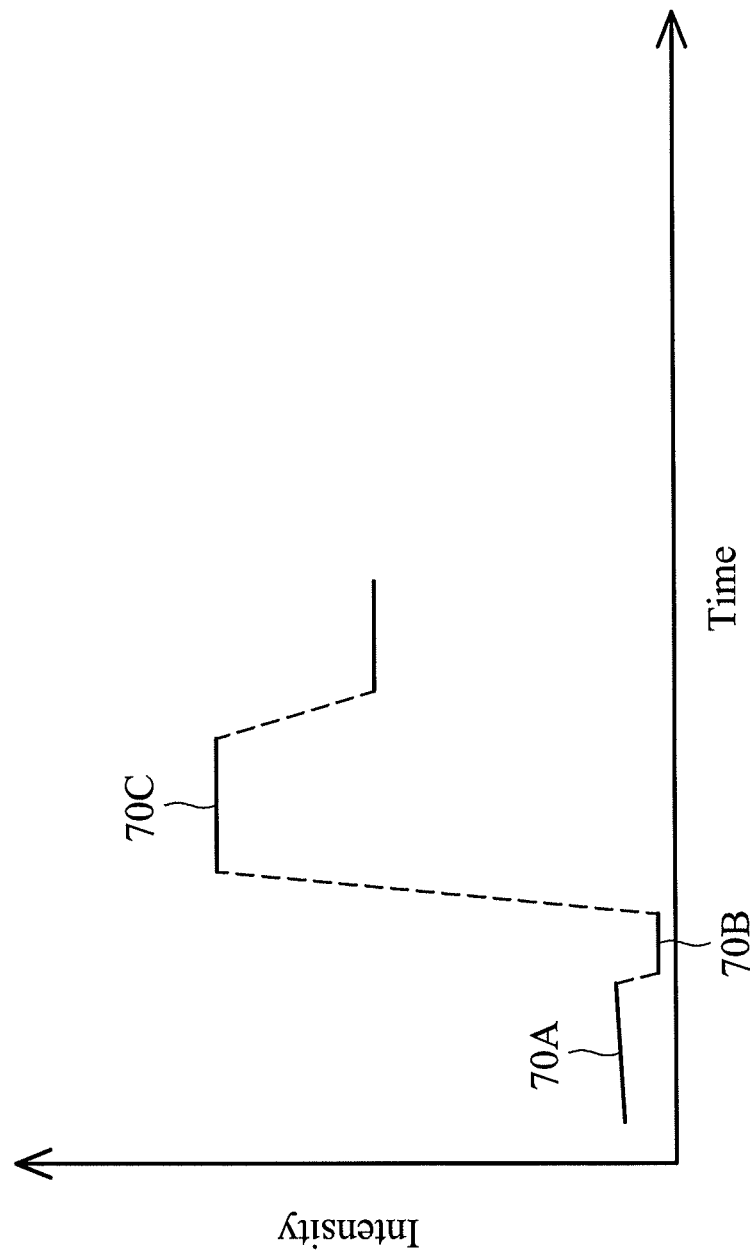
FIG. 7 schematically illustrates the light intensity of the light reflected from a wafer as a function of time in a grinding process.

FIGS. 5 through 7 illustrate a method for determining end points of grinding processes in accordance with alternative embodiments. These embodiments are similar to the embodiments shown in FIGS. 1 through 4, except that a reflectivity measured from the surface of the wafer being grinded, rather than the wheel loading, is used as criteria for determining the optimal end point. Unless specified otherwise, the materials and formation methods of the components in these embodiments are essentially the same as the like components, which are denoted by like reference numerals in the embodiments shown in FIGS. 1 through 4.

Referring to FIG. 5, light emitting/receiving gauges 60 are used for the measurement of the reflectivity, wherein light emitting/receiving gauges 60 may include light emitting gauge 60A for emitting light 62, and light receiving gauge 60B for receiving reflected light 64. Light emitting/receiving gauges 60 are non-contact gauges that do not contact wafer 20 during the grinding process. Light emitting/receiving gauges 60 may be parts of a reflectivity measurement tool, which is configured to measure the reflectivity by emitting light 62, measure the intensity of the reflected light, and calculating the reflectivity. Since light 64 may be reflected from the surface and also from the internal features of wafer 20, the reflectivity may be a function of the surface materials and the materials buried under the surface of wafer 20. The reflectivity may also be a function of the topology of the features in wafer 20.

Referring to FIG. 6, during the grinding process, light 62 that is emitted by light emitting/receiving gauges 60 is projected onto point 68 (which actually forms a circle with the rotation of wafer 20) of wafer 20. It is realized that even if light 62 may be projected to a fixed direction, and may be projected to one of metal post 26 (FIG. 1) at one time, with the spinning of wafer 20, at different time points, light 62 may be projected onto other features on wafer 20 such as molding compound 30 between dies 22 (FIG. 5). The measured reflectivity is thus the averaged result obtained from circle 68.

FIG. 7 schematically illustrates the intensity of the reflected light 64 (FIG. 5) as a function of time in an exemplary grinding process. Since the incident light 62 in FIG. 5 may have a fixed intensity, the intensity of the reflected light 64 may also represent the reflectivity since the reflectivity may be calculated by dividing the intensity of reflected light 64 by the intensity of the incident light 62. In the grinding process, the illustrated light intensity includes several sections, including 70A, 70B, and 70C, which correspond to grinding a molding compound layer, a polyimide layer, and a copper layer, respectively. FIG. 7 reveals that for different materials, the intensities of the reflected light 64, and hence the reflectivity, are different. Accordingly, the reflectivity may be used as an indicator for determining the optimal end point of the grinding process.

Figure 8:
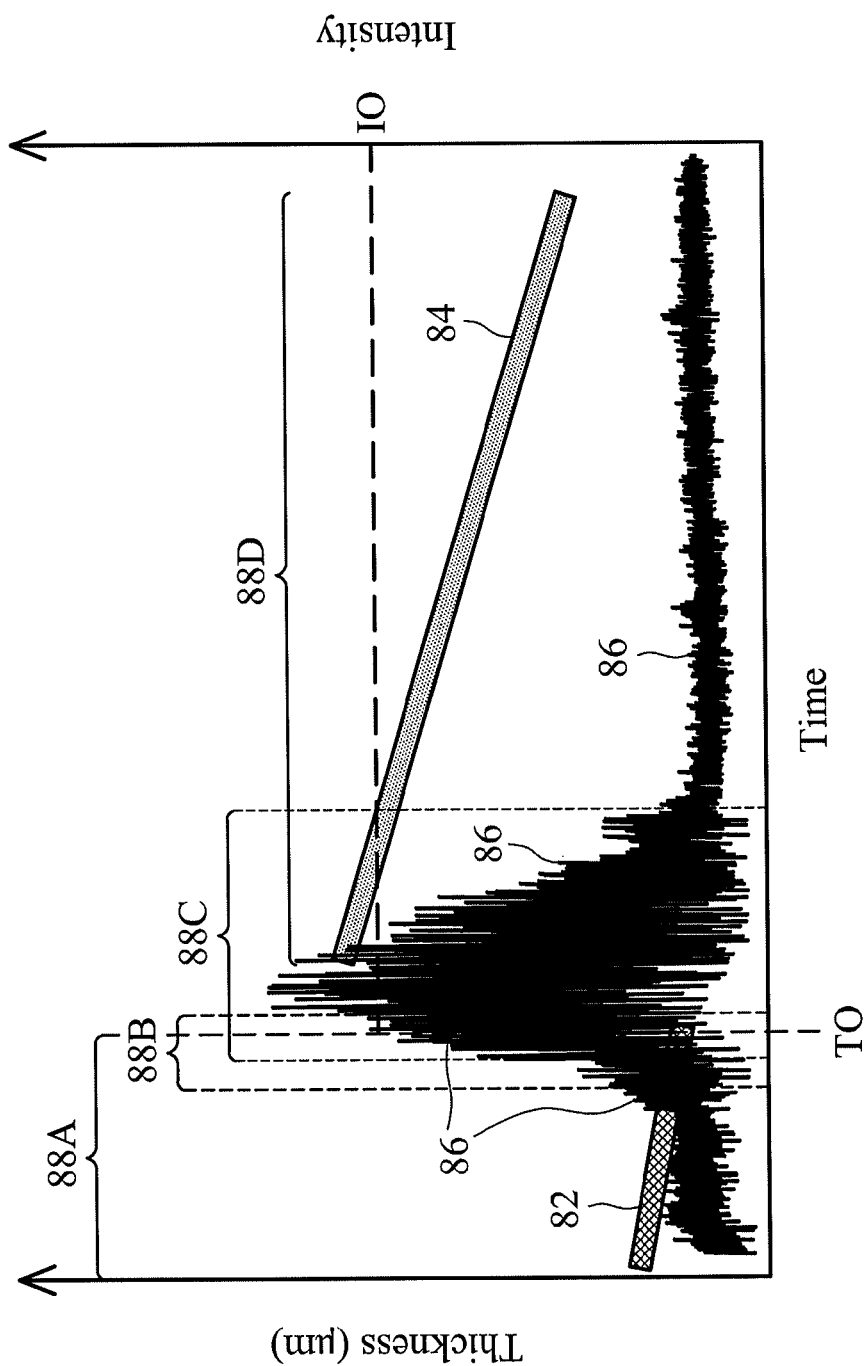
FIG. 8 illustrates thicknesses of a sample wafer and the intensity of the received reflected light as functions of a grinding time.

FIG. 8 illustrates the experiment results obtained from the grinding process of a sample fan-out wafer, wherein the thickness of the sample wafer and the intensity of the reflected light are illustrated as functions of grinding time. The left Y-axis shows the wafer thicknesses, and corresponds to lines 82 and 84. The right Y-axis shows the light intensity, and corresponds to the waveform 86. Line 82 represents the thickness of molding compound 30 (FIG. 1) as a function of grinding time, while line 84 represents the thickness of silicon substrate 24 (FIG. 1) as a function of grinding time. As shown in FIG. 8, the thickness of molding compound 30 is reduced with the proceeding of the grinding process. In the meantime, since other features such as polymer layer 28 and copper posts may be exposed with the proceeding of the grinding, with time, the light intensity (waveform 86) increases. The regions where molding compound 30, polymer layer 28, metal posts 26, and silicon substrate 24 are grinded are also shown as regions 88A, 88B, 88C, and 88B. An optimal end point may be selected when metal posts 26 and polymer layer 28 are both being grinded. Accordingly, time point T0 may be selected as an exemplary optimal end point, and the corresponding light intensity I0 is used to calculate the target reflectivity.

In general, in accordance with embodiments, a target reflectivity corresponding to the optimal end point may be found, for example, by performing a grinding process on a sample wafer, performing inspections periodically, and calculating the target reflectivity (such as from intensity level I0 in FIG. 8). On the production wafers that have the same structure as the sample wafer, the optimal end point is when the target reflectivity is reached. In other embodiments, the optimal end point is such determined that after the target reflectivity is reached, an extended grinding is performed for an extended period of grinding time, or for reducing the thickness of wafer 20 by a pre-determined value. The optimal duration for the extended grinding may be found through experiments.

In accordance with embodiments, a method for performing grinding includes selecting a target wheel loading for wafer grinding processes, and performing a grinding process on a wafer. With the proceeding of the grinding process, wheel loadings of the grinding process are measured. The grinding process is stopped after the target wheel loading is reached.

In accordance with other embodiments, a method includes grinding a sample wafer using a grind wheel, during the step of grinding the sample wafer, monitoring wheel currents for driving the grind wheel, inspecting the sample wafer to determine an optimal end point of the grinding process, and recording one of the wheel currents corresponding to the optimal end point as a target wheel current. A grinding process is performed on a production wafer substantially identical to the sample wafer. During the step of grinding the production wafer, wheel currents for grinding the production wheel are monitored. The grinding process is stopped after the target wheel current is reached.

In accordance with yet other embodiments, a method includes selecting a target reflectivity of wafer grinding processes, and performing a grinding process on a wafer. With a proceeding of the grinding process, reflectivities of a light reflected from a surface of the wafer are measured. The grinding process is stopped after one of the reflectivities reaches the target reflectivity.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
grinding a sample wafer using a grind wheel;
during the step of grinding the sample wafer, monitoring wheel currents for driving the grind wheel;
inspecting the sample wafer to determine an optimal end point of the grinding of the sample wafer;
recording one of the wheel currents corresponding to the optimal end point as a target wheel current;
performing a grinding process on a production wafer substantially identical to the sample wafer;
during the step of grinding the production wafer, monitoring wheel currents for grinding the production wafer; and
stopping the grinding process after the target wheel current is reached.

2. The method of claim 1 further comprising, when the target wheel current is reached, performing an extended grinding to remove a layer of the production wafer having a pre-determined thickness, wherein the step of stopping the grinding process is performed upon finishing of the extended grinding.

3. The method of claim 2 further comprising, wherein the pre-determined thickness is between about 1 µm and about 5 µm.

4. The method of claim 2, wherein the step of performing the extended grinding is performed automatically.

5. The method of claim 1 further comprising, when the target wheel current is reached, performing an extended grinding for a pre-determined period of time, wherein the step of stopping the grinding process is performed upon finishing of the extended grinding.

6. The method of claim 1, wherein the production wafer comprises:
a plurality of device dies comprising metal posts; and
a molding compound disposed in spaces between the plurality of device dies and over the plurality of device dies.

7. The method of claim 6, wherein the optimal end point is when the metal posts in all of the device dies are exposed, and no over-grinding occurs to the metal posts.

8. The method of claim 1, wherein the monitoring the wheel currents comprises comparing the wheel currents for grinding the production wafer to the target wheel current to determine whether the target wheel current is reached.

9. A method comprising:
predetermining a target wheel current, wherein the pre-determining comprises:
grinding a sample wafer;
during the grinding the sample wafer, monitoring wheel currents for grinding the sample wafer;
inspecting the sample wafer to determine an optimal end point of the grinding; and
recording one of the wheel currents corresponding to the optimal end point as the target wheel current;
pre-selecting an extended grinding process;
performing a grinding on a wafer, wherein the wafer has a same structure as the sample wafer;
during the grinding, monitoring a wheel current of a grinding wheel used for grinding the wafer;
starting the pre-selected extended grinding process once the wheel current reaches the target wheel current; and
stopping the grinding once the pre-selected extended grinding process is finished.

10. The method of claim 9, wherein the wafer comprises a plurality of metal posts, and a molding compound covering the plurality of metal posts, and wherein in the grinding, the molding compound and the plurality of metal posts are grinded.

11. The method of claim 10, wherein at a time the grinding is started, the molding compound is grinded, and the plurality of metal posts is buried under a top layer of the molding compound.

12. The method of claim 10, wherein at a time the pre-selected extended grinding process is started, the plurality of metal posts is exposed.

13. The method of claim 10, wherein the monitoring the wheel current of the grinding wheel comprises comparing the wheel current of the grinding wheel to the target wheel current to determine whether the target wheel current is reached.

14. The method of claim 9, wherein the pre-selected extended grinding is performed for a pre-determined period of time.

15. The method of claim 9, wherein the pre-selected extended grinding is performed by grinding a pre-determined thickness from the wafer.

* * * * *